US 8,176,388 B1

(12) United States Patent
Moshe et al.

(10) Patent No.: US 8,176,388 B1
(45) Date of Patent: May 8, 2012

(54) SYSTEM AND METHOD FOR SOFT ERROR SCRUBBING

(75) Inventors: Michael Moshe, Kiriat Tivon (IL); Yosef Solt, Atzom (IL); Amit Avivi, Khar-Saba (IL); Aron Wohlgemuth, Givat Shmumel (IL)

(73) Assignee: Marvell Israel (MISL) Ltd. (IL)

( * ) Notice: Subject to any disclaimer, the term of this patent is extended or adjusted under 35 U.S.C. 154(b) by 993 days.

(21) Appl. No.: 12/142,590

(22) Filed: Jun. 19, 2008

Related U.S. Application Data

(60) Provisional application No. 60/945,213, filed on Jun. 20, 2007, provisional application No. 60/953,590, filed on Aug. 2, 2007.

(51) Int. Cl.
*G11C 29/00* (2006.01)
(52) U.S. Cl. ....................................................... 714/764
(58) Field of Classification Search ................... 714/764
See application file for complete search history.

(56) References Cited

U.S. PATENT DOCUMENTS

| | | | | | |
|---|---|---|---|---|---|
| 4,982,360 | A | * | 1/1991 | Johnson et al. | 711/108 |
| 5,555,397 | A | * | 9/1996 | Sasama et al. | 711/158 |
| 5,987,628 | A | * | 11/1999 | Von Bokern et al. | 714/48 |
| 7,594,158 | B2 | * | 9/2009 | Wickeraad | 714/773 |
| 7,797,610 | B1 | * | 9/2010 | Simkins | 714/763 |
| 2003/0009721 | A1 | * | 1/2003 | Hsu et al. | 714/773 |
| 2007/0113150 | A1 | * | 5/2007 | Resnick et al. | 714/763 |

OTHER PUBLICATIONS

AMD; BIOS and Kernel Developer's Guide for AMD Athlon™ 64 and AMD Opteron™ Processors; Publication No. 26094, Revision 3.30, Issue Date Feb. 2006; Entire Document.

* cited by examiner

*Primary Examiner* — Robert Beausoliel, Jr.
*Assistant Examiner* — Neil Miles

(57) ABSTRACT

A data processing system includes a memory configured to store data in a plurality of addressable storage spaces thereof, wherein the memory includes a first data port and a second data port, a first functional block configured to access the memory via the first data port to perform a logic operation, and a second functional block configured to access the memory via the second data port to perform soft error scrubbing in the data stored in the memory.

23 Claims, 6 Drawing Sheets

SYSTEM AND METHOD FOR SOFT ERROR SCRUBBING

CROSS REFERENCE TO PRIOR APPLICATIONS

This application claims priority and the benefit thereof from a U.S. Provisional Application Nos. 60/945,213 filed on Jun. 20, 2007 and 60/953,590 filed on Aug. 2, 2007, which are hereby incorporated by reference for all purposes as if fully set forth herein.

BACKGROUND

1. Field of the Disclosure

This disclosure relates to soft error scrubbing, particularly to a system and method for soft error scrubbing in memory devices.

2. Related Art

A soft error is a signal or datum which has been changed from its original value, typically because of environmental and other influences, such as, radiation, on a memory. A soft error may be corrected by rewriting correct data in place of erroneous data. However, in many systems, it may be difficult to detect a soft error, determine correct data of the soft error and replace the erroneous data with the correct data, which are commonly referred to as "soft error scrubbing," without suffering a performance loss. Furthermore, before performing soft error scrubbing, the system may crash due to a soft error, and a recovery procedure may need to be followed including a reboot.

SUMMARY

In one aspect of the disclosure, a data processing system includes a memory configured to store data in a plurality of addressable storage spaces thereof, wherein the memory includes a first data port and a second data port, a first functional block configured to access the memory via the first data port to perform a logic operation, and a second functional block configured to access the memory via the second data port to perform soft error scrubbing in the data stored in the memory.

According to another aspect of the disclosure, a data processing system includes a memory configured to store data in addressable storage spaces, an arbiter connected to the memory, wherein the arbiter includes a first data port and a second data port, a first functional block configured to connect the first data port, wherein the first functional block is further configured to access the memory to perform a logic operation, and a second functional block configured to connect the second data port, wherein the second functional block is further configured to access the memory to perform soft error scrubbing in the memory.

In yet another aspect of the disclosure, a data processing system includes a content-addressable memory (CAM) including a plurality of addressable storage spaces for storing data, and a soft error scrubber (SES) configured to perform soft error scrubbing on the data stored in the CAM.

In yet another aspect of the disclosure, a method for using a content-addressable memory (CAM) including a plurality of addressable storage spaces for storing data, the method including reading first data stored in a first addressable storage space of the CAM, detecting a soft error in the first data, and writing correct first data in the first addressable storage space of the CAM.

In yet another aspect of the disclosure, a method for using a data processing system including a memory, a first functional block and a second functional block, the memory including a plurality of addressable storage spaces, a first data port in communication with the first functional block, and a second data port in communication with the second functional block, the method including sending a first read request for a first address of the memory for a logic operation performed by the first functional block, sending a second read request for a second address of the memory for soft error scrubbing performed by the second functional block, comparing the first address and the second address, outputting first data stored in the first address and second data stored in second address to the first functional block and the second functional block, respectively, via the first port and the second port, respectively, when the first address and the second address are different, and performing the soft error scrubbing on the second data by operating the second functional block.

In yet another aspect of the disclosure, a method for using a data processing system including a memory, an arbiter, a first functional block and a second functional block, the memory including a plurality of addressable storage spaces, the arbiter in communication with the memory and including a first data port in communication with the first functional block and a second data port in communication with the second functional block, the method including sending a first read request to the arbiter for a first address of the memory for a logic operation performed by the first functional block, sending a second read request to the arbiter for a second address of the memory for soft error scrubbing performed by the second functional block, comparing the first address and the second address, outputting the first data stored in the first address of the memory to the first functional logic via the first port of the arbiter, outputting the second data stored in the second address of the memory to the second functional logic via the second port of the arbiter when the first address and the second address are different, and performing the soft error scrubbing on the second data by operating the second functional block.

Additional features, advantages, and embodiments of the disclosure may be set forth or apparent from consideration of the following detailed description, drawings, and claims. Moreover, it is to be understood that both the foregoing summary of the disclosure and the following detailed description are mere examples and intended to provide further explanation without limiting the scope of the disclosure as claimed.

BRIEF DESCRIPTION OF THE DRAWINGS

The accompanying drawings illustrate embodiments of the disclosure, and together with the detailed description serve to explain teaching principles of the disclosure. No attempt is made to show structural details of the disclosure in any more detail than may be necessary to understand teaching principles and elucidate examples of various ways in which it may be practiced. In the drawings.

DETAILED DESCRIPTION

Figure 1A:
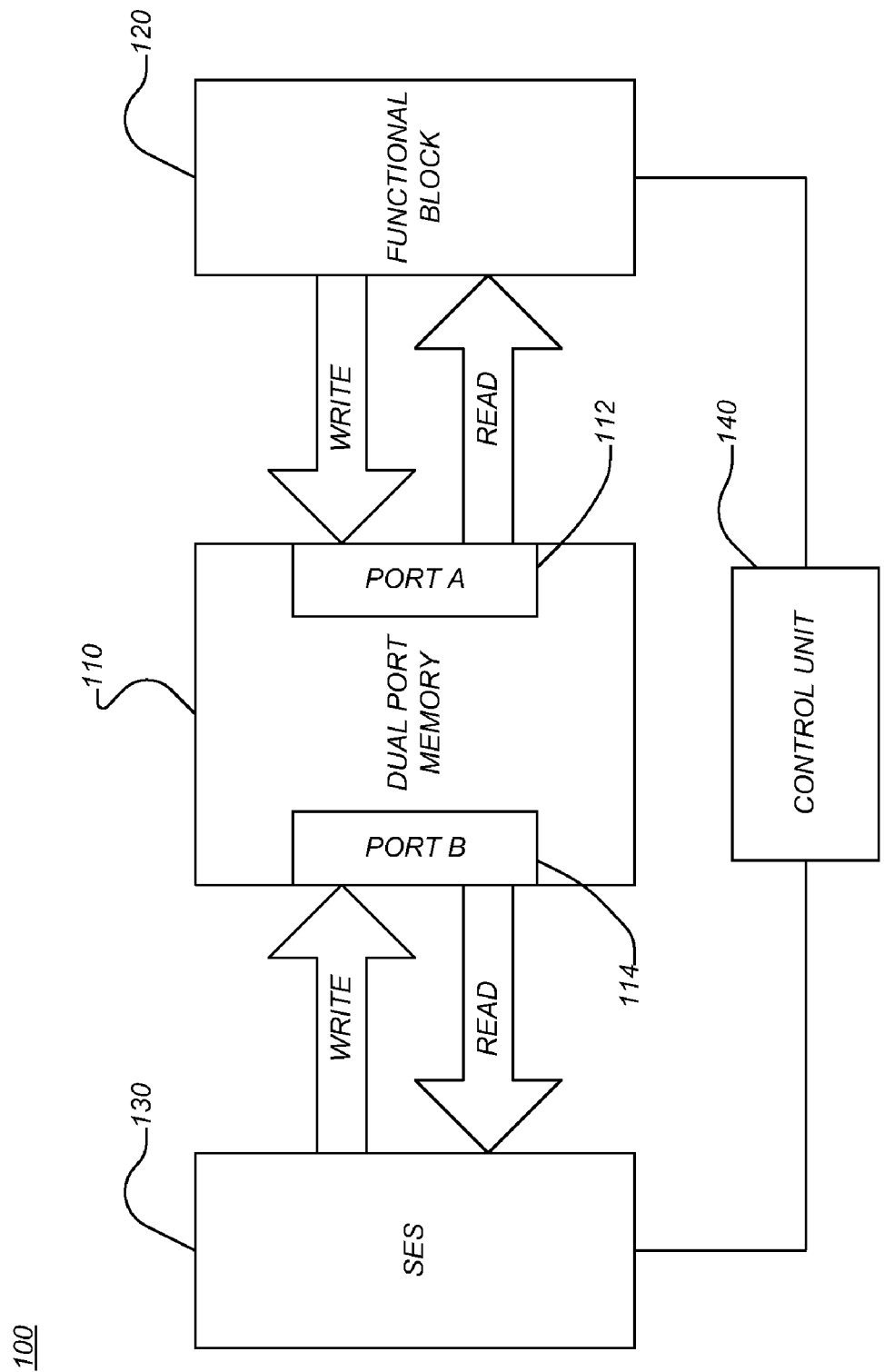
FIG. 1A shows an architectural overview of a data processing system employing soft error scrubbing functionality with a dual port memory, in accordance with the disclosure.

The embodiments of the disclosure and various features thereof are explained more fully with reference to the non-limiting embodiments and examples that are described and/or illustrated in the accompanying drawings and detailed in the following description. It should be noted that the features illustrated in the drawings are not necessarily drawn to scale, and that features of one embodiment may be employed with other embodiments. Descriptions of well-known components and processing techniques may be omitted so as to not unnecessarily obscure teaching principles of embodiments described herein. The examples used herein are intended merely to facilitate an understanding of ways in which embodiments of the disclosure may be practiced and to further enable those of skill in the art to practice the embodiments of the disclosure. Accordingly, the examples and embodiments herein should not be construed as limiting the scope of the disclosure, which is defined solely by the appended claims and applicable law. Moreover, it is noted that like reference numerals represent similar parts throughout the several views of the drawings.

Soft error rate (SER) is a rate at which a device or system encounters or is predicted to encounter soft errors. It is typically expressed as a number of failures-in-time (FIT), which may be adopted for quantifying failures in time. While many electronic systems may have a FIT that exceeds the expected lifetime of the system, the SER may still be unacceptable to the manufacturer or customer. For example, in safety-critical or cost-critical applications where the cost of system failure may far exceed the cost of the system itself, a 1% chance of soft error failure per lifetime may be too high to be acceptable to the customer.

Data processing typically involves storing data in addressable storage spaces of a memory, reading data from the memory, executing one or more logic operations based on the data, writing new data to the memory and/or the like. For example, a microprocessor may include one or more cache memories and one or more logic blocks. Each logic block may read data stored in the cache memory, execute one or more logic operations based on the data, write new data to a specific storage space of the cache memory and/or the like. In order to reduce or eliminate FIT in the cache memory, the logic block may perform soft error scrubbing regularly, which typically requires reading data stored in the cache memory, detecting a soft error in the data, writing correct data back to the memory to replace any erroneous data therein and/or the like.

However, for devices that constantly process a large amount of data, such as, e.g., a microprocessor, a network router or the like, it may be difficult or nearly impossible to perform soft error scrubbing regularly without performance loss because the logic blocks may have to stop executing logic operations before performing soft error scrubbing. Further, the more data in the memory a logic block processes, the less chances the logic block may get to perform soft error scrubbing, which may result in a system failure due to soft errors.

FIG. 1A shows an architectural overview of a data processing system 100 employing soft error scrubbing functionality, in accordance with the disclosure. The data processing system 100 may be configured with a dual port memory 110, a functional block 120, a soft error scrubber (SES) 130, a control unit 140 and/or the like. Each of the dual port memory 110, the functional block 120, the SES 130, and the control unit 140 may be implemented as any of a sub-block of a logic block or a memory block of a microchip, a logic block or a memory block of a microchip, a component or a module of an electronic device, a module of a component, a component of a module, a microchip of a module or a component, or the like.

In an embodiment, the dual port memory 110 may be a cache memory in a microprocessor for example. However, without departing from the scope and/or spirit of the disclosure, the dual port memory 110 may include a DRAM, a CAM, and/or any other suitable electronic memory device which includes a plurality of addressable storage spaces for storing data. Each addressable storage space may be a single addressable storage unit (e.g., a single memory cell) or a group of addressable storage units (e.g., a row of memory cells). The functional block 120 may include one or more logic circuits, such as, for example, an adder circuit, a subtraction circuit, a multiplier circuit or any other logic circuit that may perform one or more logic operations based on the data read from the dual port memory 110 and/or other logic circuit. The SES 130 may be configured to perform soft error scrubbing, which may include reading data from the dual port memory 110, detecting a soft error in the data, writing correct data back to the dual port memory 110 and/or the like. The SES 130 may include a storage for storing correct data.

The dual port memory 110 may have two independent data ports: a data port A 112 and a data port B 114, such that the functional block 120 and the SES 130 may simultaneously access the dual port memory 110. The functional block 120 may access data stored in an addressable storage space in the dual port memory 110 via the data port A 112. Meanwhile, the SES 130 may access data stored in another addressable storage space via the data port B 114. Since the SES 130 may access any data stored in any addressable storage space via the data port B 114, the SES 130 may perform soft error scrubbing more frequently, thereby significantly reducing or eliminating the FIT. Further, since the functional block 120 may not need to perform soft error scrubbing, the functional block 120 may execute a greater number of logic operations, thereby increasing the system performance.

In an embodiment, the data processing system 100 may further include the control unit 140 for administrating the operations of the functional block 120 and the SES 130. For example, the control unit 140 may monitor the operations being performed or to be performed by the functional block 120, which may include reading and/or writing data stored in a certain addressable storage space of the dual port memory 110. Then, the control unit 140 may instruct the SES 130 to avoid accessing the addressable storage space until the functional block 120 completes its operation involving the data stored therein. Alternatively, the control unit 140 may be configured to have a more dominant role in the data processing system 100. For example, the control unit 140 may be configured to decide which data should go to the functional block 120 or the SES 130 to optimize soft error scrubbing without interfering with the operations of the functional block 120. For example, soft error scrubbing may be performed on addressable storage spaces that are not in use by the functional block 120, and that are not contemplated to be required until after soft error scrubbing is completed.

Figure 1B:
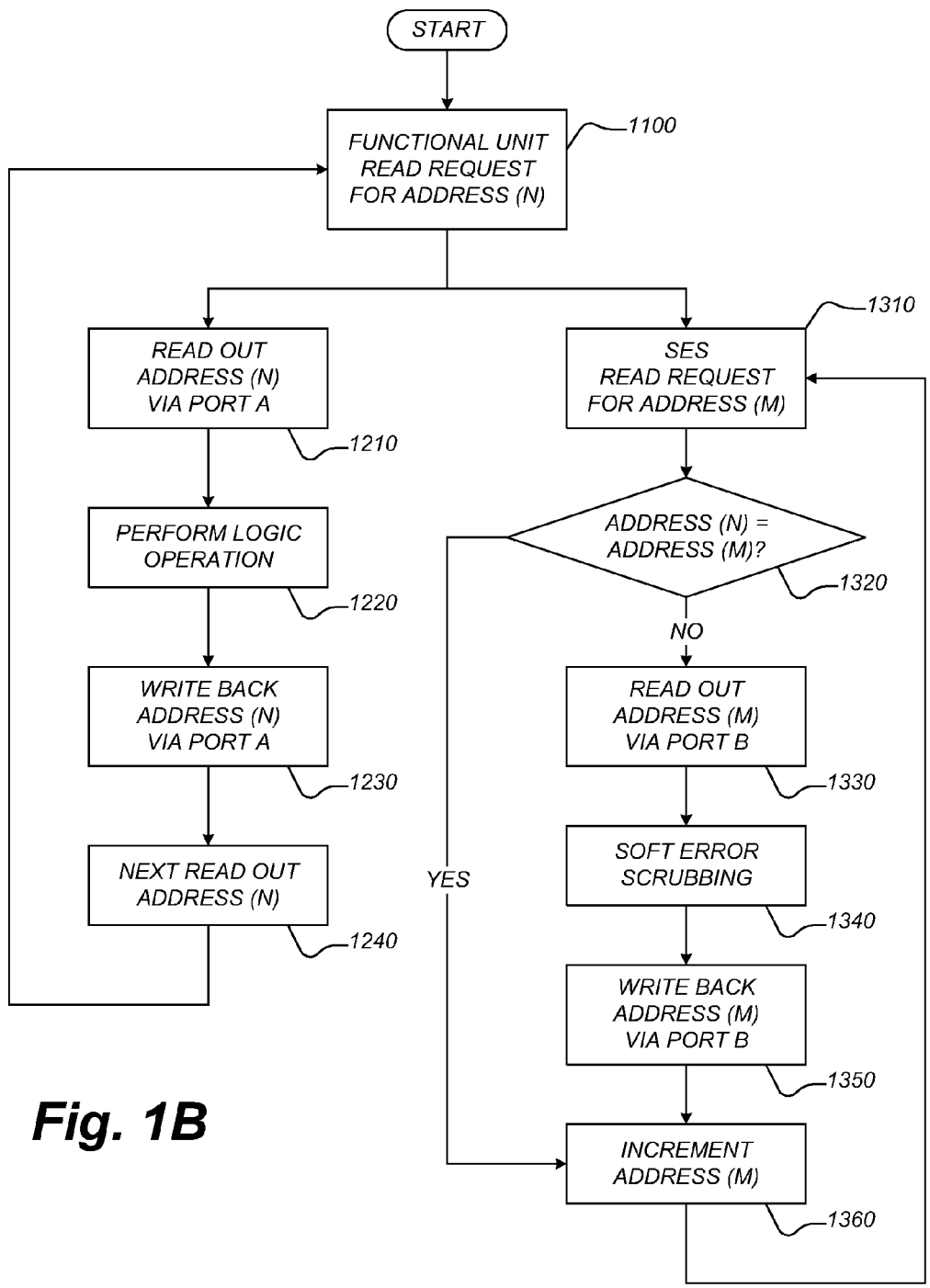
FIG. 1B shows a flow chart of performing a logic operation and soft error scrubbing in the data processing system employing the dual port memory shown in FIG. 1A, operated in accordance with the disclosure.

FIG. 1B shows a flow chart of performing a logic operation and soft error scrubbing in the data processing system 100 employing the dual port memory 110 shown in FIG. 1A, operated in accordance with an embodiment of the disclosure. Upon starting the operation, the functional block 120 may send a read request to the dual port memory 110 with a read out address (N) (step 1100) to perform a logic operation. In response, the dual port memory 110 may output the data stored in the read out address (N) via the port A 112 (step 1210). Then, the functional block 120 may perform a logic operation based on the read out data (step 1220). If necessary, the functional block 120 may send a write request to the dual port memory 110 with a write back data for the address (N) via the port A 112 (step 1230). Upon completing the logic operation involving the read out data (step 1220), the functional block 120 may update the read out address (N) for the next logic operation (step 1240), and the process may loop back such that the functional unit 120 may send the next read request to the dual port memory 110 with the next read out address (N) (step 1100).

Concurrently with the aforementioned operations performed by the dual port memory 110 and the functional block 120 via the port A 112, the SES 130 may perform sort error scrubbing on the dual port memory 110 via the port B 114. For example, the SES 130 may send a read request to the dual port memory 110 with a read out address (M) for soft error scrubbing (step 1310). The read out address (M) from the SES 130 may be compared to the read out address (N) from the functional block 120 (step 1320) to determine whether the functional block 120 and the SES 130 have requested simultaneous access to the same addressable storage space.

If the read out address (M) requested from the SES 130 and the read out address (N) requested from the functional block 120 are different (NO, step 1320), the dual port memory 110 may output data stored in the read out address (M) via the port B 114 (step 1330), and the SES 130 may perform soft error scrubbing on the read out data (step 1340). If an error is found in the read out data, the SES 130 may send a correct data for the address (M) to the dual port memory 110 via the port B 114 (1350) to perform a write back operation. If no error has been found in the read out data or the correct data has been written back to the address (M) of the dual port memory 110, the SES 130 may perform soft error scrubbing on another addressable storage space by, for example, incrementing the read out address (M) for soft error scrubbing (step 1360), and the process may loop back such that the SES 130 may send a read request to the dual port memory 110 with a new read out address (M) for soft error scrubbing (step 1310). Since the functional block 120 and the SES 130 may access the dual port memory 110 via different data ports, i.e., the port A 112 and the port B 114, respectively, the functional block 120 and the SES 130 may simultaneously perform their respective operations on the address (N) and the address (M), respectively, with little or no interference.

In the case that the read out address (M) from the SES 130 and the read out address (N) from the functional block 120 are identical (YES, step 1320), the SES 130 may not be allowed to access the read out address (M) to avoid interfering with the current operation of the functional block 120 involving the read out address (M). Instead, the process may advance such that the SES 130 may increment the read out address (M) to perform soft error scrubbing on another addressable storage space (step 1360), and the process may loop back such that the SES 130 may send a read out request to the dual port memory 110 with the next read out address (M) (step 1310).

Thus, according to the disclosure, effective and efficient soft error scrubbing may be achieved in a system by employing a dual port memory and an SES with little or no conflict between a functional block and the SES. Since the functional block may no longer be required to perform soft error scrubbing, the system performance may increase while FIT may be significantly reduced or eliminated.

Figure 2A:
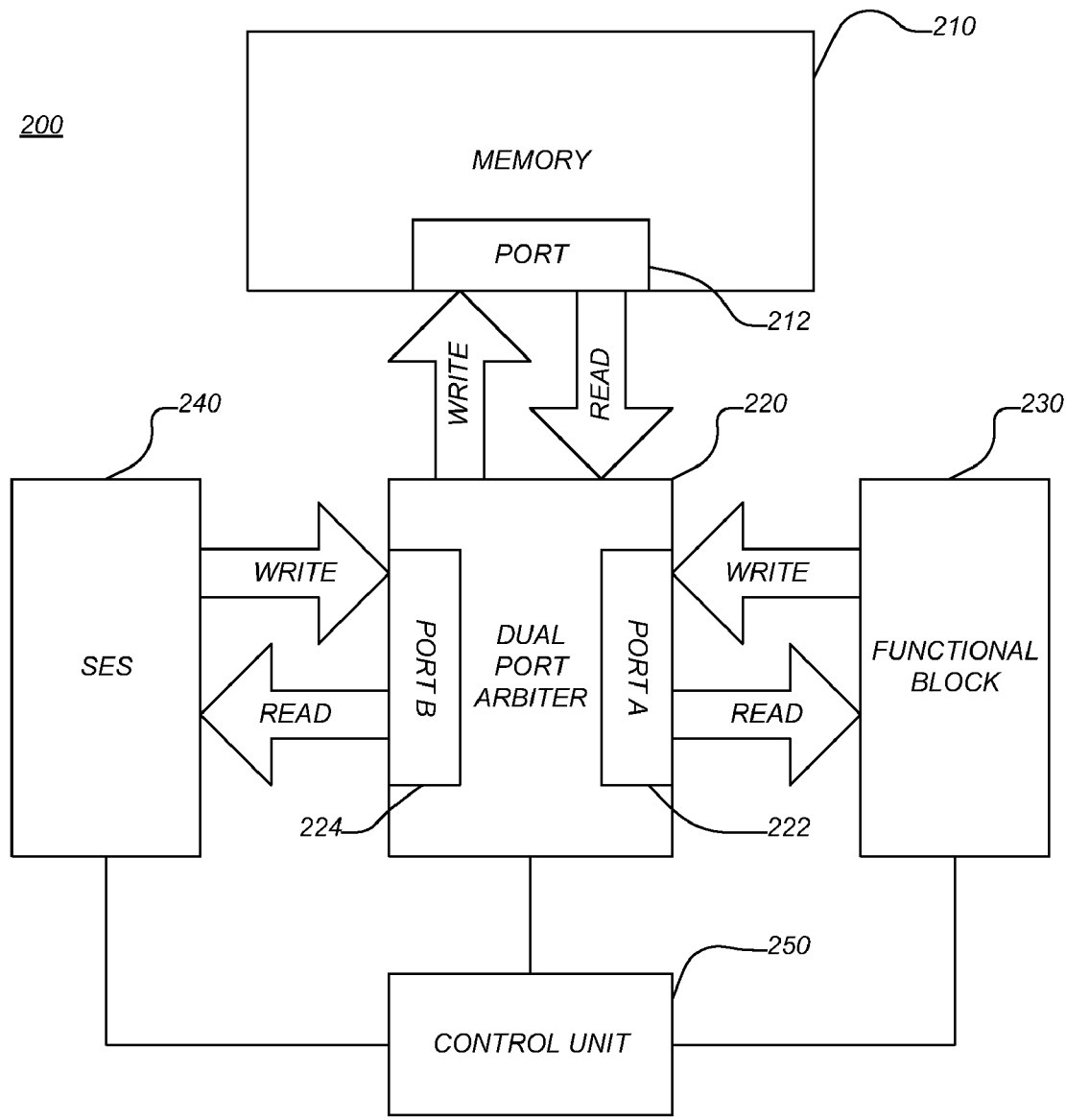
FIG. 2A shows an architectural overview of another data processing system employing soft error scrubbing functionality with a single port memory and a dual port arbiter, constructed in accordance with the disclosure.

FIG. 2A shows another architectural overview of another data processing system 200 employing soft error scrubbing functionality, in accordance with an embodiment of the disclosure. The data processing system 200 may be configured with a memory 210, a dual port arbiter 220, a functional block 230, an SES 240, a control unit 250 and/or the like. Each of the memory 210, the dual port arbiter 220, the functional block 230, the SES 240, and the control unit 250 may be implemented as any of a sub-block of a logic block or a memory block of a microchip, a logic block or a memory block of a microchip, a component or a module of an electronic device, a module of a component, a component of a module, a microchip of a module or a component, or the like.

The SES 240 may be configured to perform soft error scrubbing and, hence, may be configured similarly or identically to the SES 130 shown in FIG. 1. The functional block 230 may be configured to perform one or more logic operations based on data stored in the memory 210. The memory 210 may be a single port memory with a single data port 212. The dual port arbiter 220 may be connected to the data port 212 of the memory 210. The dual port arbiter 220 may have two data ports including a data port A 222 and a data port B 224. The functional block 230 may be connected to the data port A 222 of the dual port arbiter 220, and the SES 240 may be connected to the data port B 224 of the dual port arbiter 220, as seen in FIG. 2A.

The SES 240 may access the memory 210 with little or no interference with the operation of the functional block 230. For example, the SES 240 may request the dual port arbiter 220 to read data stored in a certain addressable storage space of the memory 210 for soft error scrubbing. If there has been a request for the same addressable storage space by the functional block 230, the dual port arbiter 220 may not process the request from the SES 240 until the access to the requested addressable storage space by the functional block 230 is completed. Instead, the SES 240 may request the dual port arbiter 220 to read data stored in a different addressable storage space of the memory 210. In response, the dual port arbiter 220 may access the requested addressable storage space to read the data stored therein and send the data to the SES 240 via the data port B 224. The SES 240 may determined whether the data includes a soft error. If a soft error is found, the SES 240 may send correct data to the dual port arbiter 220, which may write the correct data back to the addressable storage space, from which the erroneous data originated.

The data processing system 200 may further include a control unit 250. Similar to the control unit 140 shown in FIG. 1, the control unit 250 may be configured to administrate the operations of the functional block 230 and the SES 240 such that soft error scrubbing may be performed with little or no conflict with the logic operations of the functional block 230. For example, the control unit 250 may guide the SES 240 to perform soft error scrubbing on addressable storage spaces that are not currently being accessed by the functional block 230 and/or that will not be accessed by the functional block 230 for one or more subsequent operations since the memory 210 has only one port 212.

Alternatively or additionally, the dual port arbiter 220 and/or the control unit 250 may administrate requests from the functional block 230 and/or the SES 240. For example, while the SES 240 performs soft error scrubbing on data stored in a certain addressable storage space, the functional block 230 may request the dual port arbiter 220 to access the same addressable storage space. In this case, the dual port arbiter 220 may delay processing the request by the functional block 230 until the soft error scrubbing is completed by the SES 240 in order to avoid providing the functional block 230 with data containing a soft error.

Figure 2B:
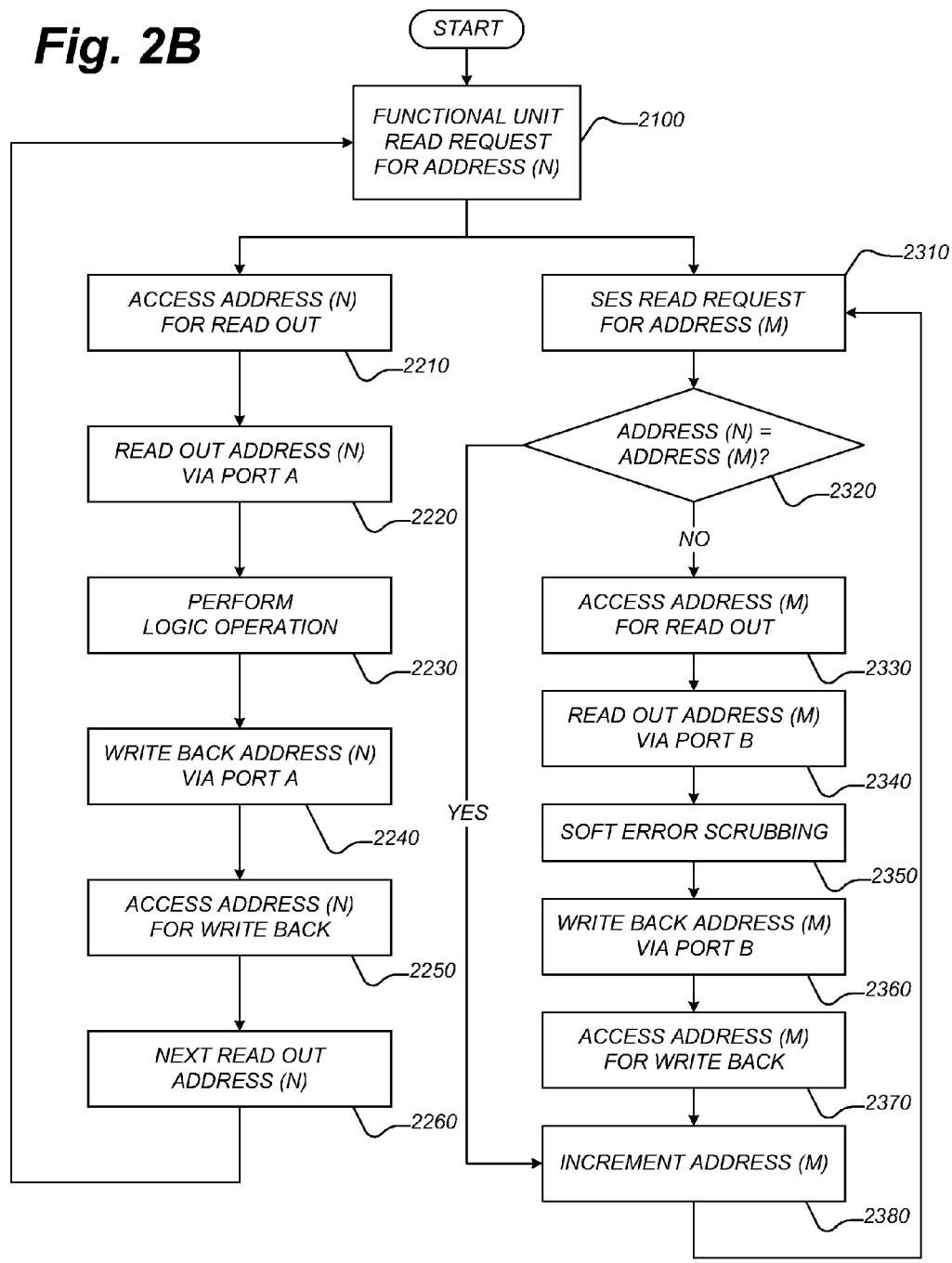
FIG. 2B shows a flowchart of performing a logic operation and soft error scrubbing in the data processing system employing the dual port arbiter shown in FIG. 2A, operated in accordance with the disclosure.

FIG. 2B shows a flow chart of performing a logic operation and soft error scrubbing in the data processing system 200 employing the dual port arbiter 220 shown in FIG. 2A, operated in accordance with an embodiment of the disclosure. Upon starting the operation, the functional block 230 may send a read request to the dual port arbiter 220 with a read out address (N) (step 2100) to perform a logic operation. In response, the dual port arbiter 220 may access the read out address (N) of the memory 210 (step 2210) and output the data stored in the read out address (N) via the port A 222 (step 2220). Then, the functional block 230 may perform a logic operation based on the read out data from the dual port arbiter 220 (step 2230). If necessary, the functional block 230 may send a write request to the dual port arbiter 220 with a write back data for the address (N) via the port A 222 (step 2240), and the dual port arbiter 220 may access the memory 210 to update the address (N) with the write back data from the functional block 230 (step 2240). Upon completing the logic operation involving the read out data in step 2230, the functional block 230 may update the read out address (N) for the next logic operation (step 2260), and the process may loop back such that the functional unit 230 may send the next read request to the dual port arbiter 220 with the next read out address (N) (step 2100).

Concurrently with the aforementioned operations performed by the dual port arbiter 220 and the functional block 230 via the port A 222, the SES 240 may perform sort error scrubbing on the memory 210 via the port B 224 of the dual port arbiter 220. For example, the SES 240 may send a read request to the dual port arbiter 220 with a read out address (M) for soft error scrubbing (step 2310). The read out address (M) from the SES 240 may be compared to the read out address (N) from the functional block 230 (step 2320) to determine whether the functional block 230 and the SES 240 have requested simultaneous access to the same addressable storage space of the memory 210.

If the read out address (M) requested from the SES 240 and the read out address (N) requested from the functional block 230 are different (NO, step 2320), the dual port arbiter 220 may access the read out address (M) of the memory 210 (step 2330) and output data stored in the read out address (M) via the port B 224 (step 2340). Then, the SES 240 may perform soft error scrubbing on the read out data (step 2350). If an error is found in the read out data, the SES 240 may send a correct data for the address (M) to the dual port arbiter 220 via the port B 224 (step 2360), and the dual port arbiter 220 may access the address (M) of the memory 210 to perform a write back operation (step 2370). If no error has been found in the read out data or the correct data has been written back to the address (M) of the memory 110, the SES 240 may perform soft error scrubbing on another addressable storage space by, for example, incrementing the read out address (M) for soft error scrubbing (step 2380), and the process may loop back such that the SES 240 may send a read request to the dual port arbiter 220 with a new read out address (M) for soft error scrubbing (step 2310).

In the case that the read out address (M) from the SES 240 and the read out address (N) from the functional block 230 are identical (YES, step 2320), the SES 240 may not be allowed to access the read out address (M) to avoid interfering with the current operation of the functional block 230 involving the read out address (M). Instead, the process may advance such that the SES 240 may increment the read out address (M) to perform soft error scrubbing on another addressable storage space of the memory 210 (step 2380). Then, the process may loop back such that the SES 240 may send a read out request to the dual port arbiter 220 with the next read out address (M) (step 2310).

Thus, according to the disclosure, soft error scrubbing may be efficiently performed in a data processing system configured with a single data port with little or no performance loss using a dual port arbiter. The system performance may be increased because soft error scrubbing may be exclusively performed by the SES 240 and the functional block 230 may no longer be required to perform any operations related to soft error scrubbing.

Figure 3:
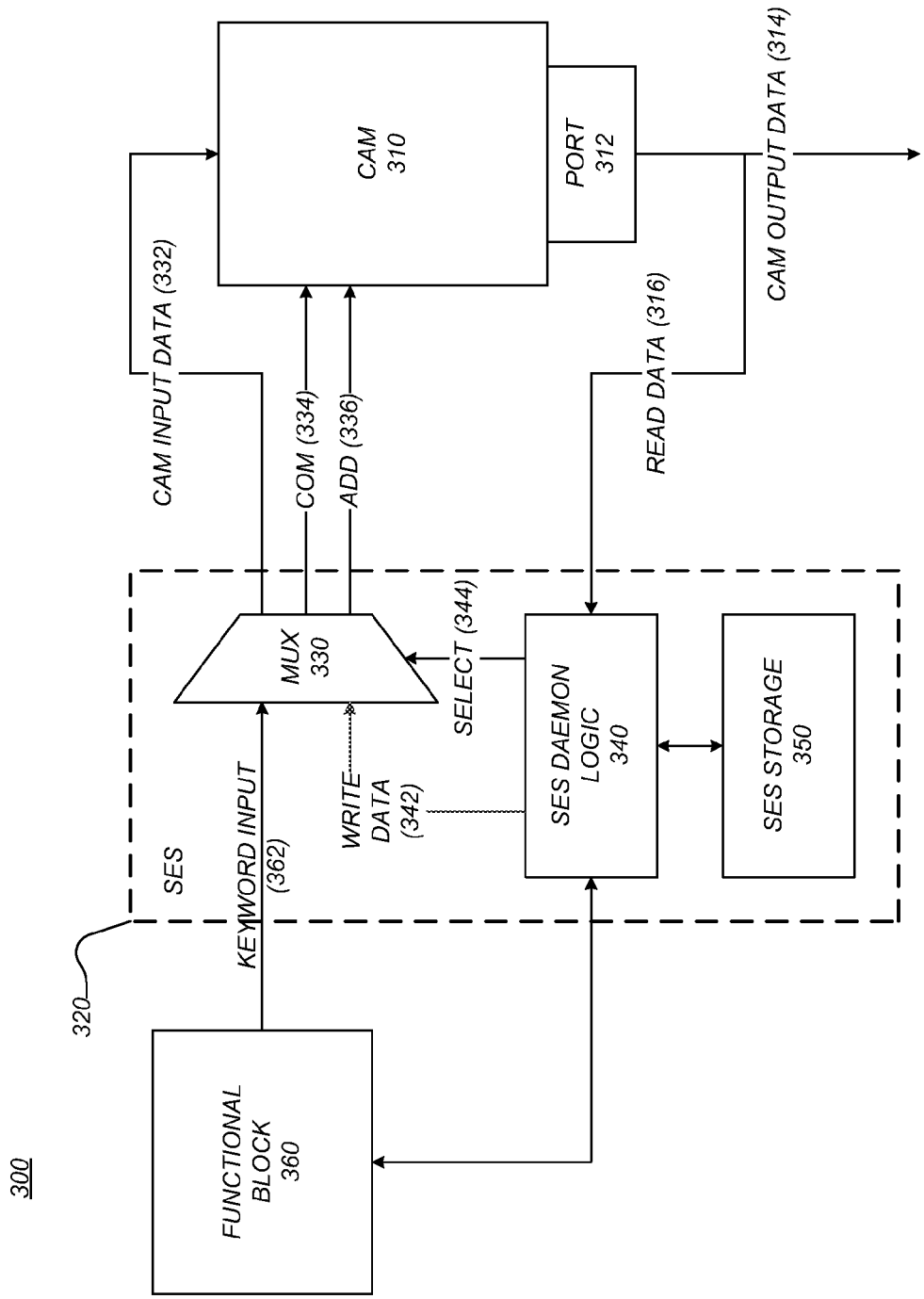
FIG. 3 shows a data processing system employing soft error scrubbing functionality for a content-addressable memory (CAM), constructed in accordance with the disclosure.

FIG. 3 shows an example of a data processing system 300 employing soft error scrubbing functionality for a single port memory, e.g., a content-addressable memory (CAM) 310, constructed in accordance with the disclosure. In an embodiment, the CAM 310 may be a ternary CAM (TCAM). In a normal operational mode, the CAM 310 may be configured to receive a keyword input, compare the keyword input with a data word stored in each row of its addressable storage spaces, and output a list of the addresses of one or more rows of the addressable storage spaces storing a matching data word. The compare operation of the CAM 310 may be typically performed in a single cycle during which all of the data words stored therein may be compared to the keyword input.

Presence of a soft error in any one or more of data words stored therein may result in outputting an address list having erroneous entries, or an address list having no matching addresses. To avoid this, the data processing system 300 may be configured such that the SES 320 may perform soft error scrubbing on the CAM 310 when the CAM 310 is in an idle mode and does not perform the compare operation. The data processing system 300 may include the CAM 310, a soft error scrubber (SES) 320, a functional block 360 and/or the like. However, it is noted that the data processing system 300 for soft error scrubbing may not be limited to the specific configuration shown in FIG. 3, and may be configured with a different configuration employing different components and algorithms.

The CAM 310 may be configured to receive a CAM input data 332, a command signal 334 and an address signal 336 from the SES 320. The command signal 334 may include a compare signal, a read signal, a write signal and/or the like. The CAM 310 may have a single data port 312, which may output a CAM output data 314 or the read data 316.

The SES 320 may include a multiplexer 330, an SES Daemon logic 340, an SES storage 350 and/or the like. The multiplexer 330 may receive the keyword input 362 from the functional block 360 and write data 342 from the SES Daemon logic 340. The multiplexer 330 may also receive a select signal 344 from the SES Daemon logic 340. The SES Daemon logic 340 may be connected to the functional block 360 to monitor the activity of the functional block 360. When the functional block 360 is not in an idle state, the SES 230 may not perform soft error scrubbing and the CAM 310 may operate in the normal operational mode. For example, the SES Daemon logic 340 may output the select signal 334 to instruct the multiplexer 330 to select the keyword input 362 from the functional block 360, and the multiplexer 330 may output a compare signal as the command signal 334 and the keyword input 362 as the CAM input data 332 to the TCAM 310. Upon receiving the keyword input 362 and the compare command signal 334, the CAM 310 may perform the compare operation to output a list of matching addresses as the CAM output data 314 via the data port 312.

When the functional block 360 is in the idle state, the SES 320 may perform soft error scrubbing on the CAM 310. For example, the SES Daemon logic 340 may output the select signal 334 to instruct the multiplexer 330 to output a read signal as the command signal 334 and a read address of an addressable storage space of the CAM 310. Then, the CAM 310 may output the data stored in the read address as the read data 316 to the SES Daemon logic 340 via the data port 312.

Upon receiving the read data 316 from the CAM 310, the SES Daemon logic 324 may determine and correct one or more soft errors in the data word. For example, the CAM 310 may be configured such that an error correction code, such as, e.g., a parity bit, a cyclic redundancy check (CDC) or the like, may be added to each data word when it is stored in the CAM 310. The error-correction code (ECC) may be added to both a data bit and a mask bit. However, it is noted that any kind of suitable error detection scheme, including, for example, but not limited to, a repetition scheme, a checksum scheme, a Hamming distance based check scheme, a Hash function scheme, a horizontal and vertical redundancy check scheme, a polarity scheme and/or the like is contemplated in this disclosure.

When it is determined that the read data 316 includes one or more soft errors, the SES Daemon logic 340 may correct the soft errors in the read data 316. For example, the SES storage 350 may include historical data information of the CAM 310 in a look-up table format such that correct data for any addressable storage space may be retrieved using an address thereof. The SES Daemon logic 340 may use the read address to locate and retrieve the correct data for the read address. After obtaining the correct data for the read address, the SES Daemon logic 340 may output the correct data as write data 342 to the multiplexer 330. Further, the SES Damon logic 340 may output the select signal 334 to instruct the multiplexer 330 to select the write data 342. Then, the multiplexer 330 may output the write data 342 as the CAM input data 332, a write signal as the command signal 334 and a write address as the address signal 336. The write address may be the read address of the addressable storage space from which the read data 316 containing a soft error is derived. Upon receiving the write command signal 334, the CAM 310 may write the write data 342 (included in the CAM input data 332) to the write address (included in the address signal 336) in order to replace the existing incorrect data stored therein.

Figure 4:
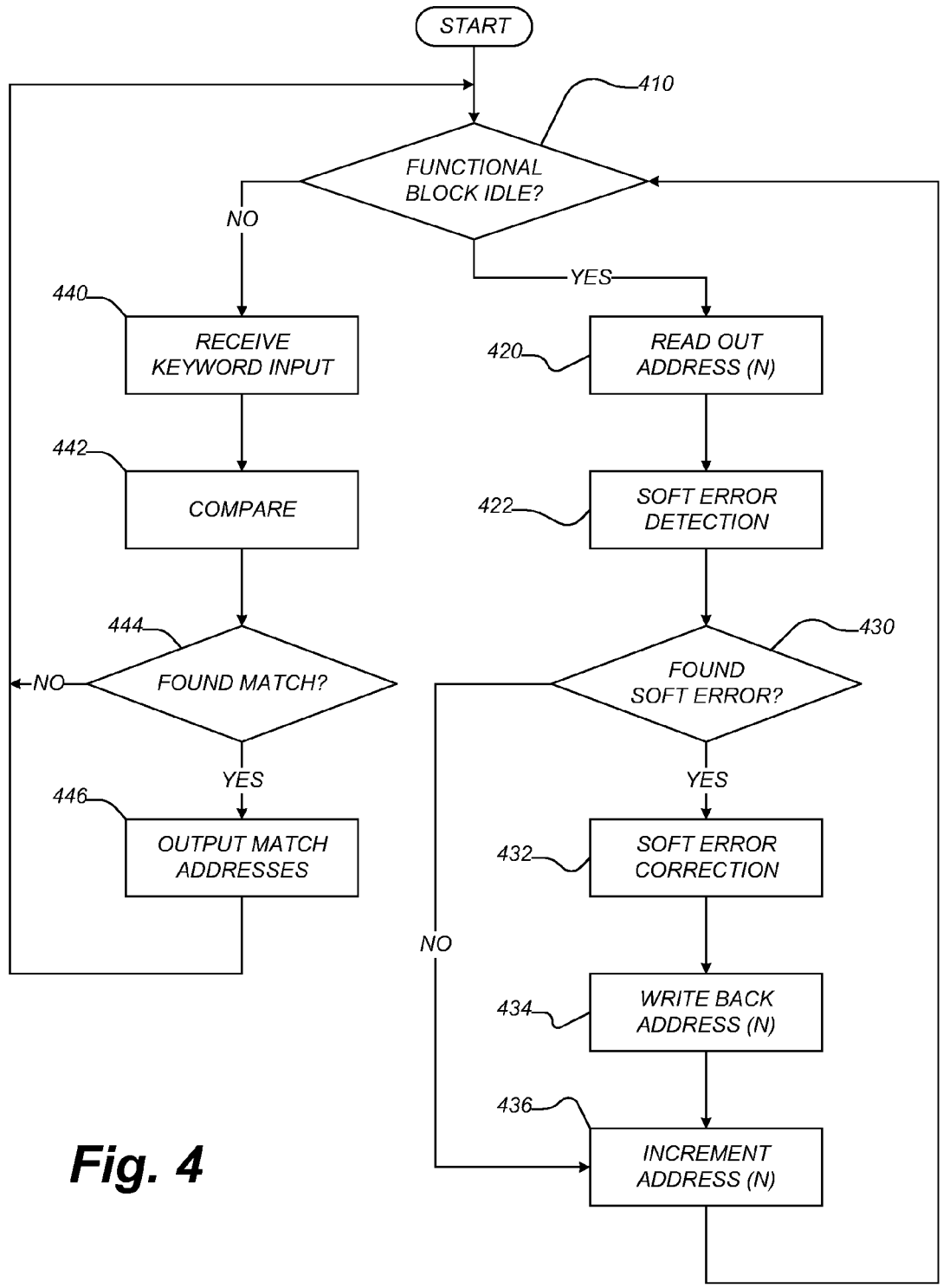
FIG. 4 shows a flow chart for scrubbing a soft error in the configuration shown in FIG. 3, constructed in accordance with the disclosure.

FIG. 4 shows a flow chart for a process for soft error scrubbing in the data processing system 300 shown in FIG. 3, constructed in accordance with the disclosure. Upon starting the process, it may be determined whether the functional block 360 is in an idle state or not (step 410). For example, the SES Daemon logic 340 may monitor the activity of the functional block 360 to determine whether the functional block 360 is in the idle state or not. If the functional block 360 is not in the idle mode, the CAM 310 may receive the keyword input 362 as the CAM input data 332 from the SES 320 (step 440) and compare the keyword input 362 with data stored in each addressable storage space (step 442). If one or more match addressable storage spaces are found (step 444), the CAM 310 may output a match address list as the CAM output data 314 (step 446). If no match addressable storage spaces are found (step 444), the process may loop back to determine whether the functional block 360 is in an idle state or not (step 410).

If it is determined that the functional block 360 is in an idle state (step 410), the process may move to perform soft error scrubbing. For example, the SES 320 may output the read signal as the command signal 334 and a read address (n) as the address signal 336 to the CAM 310. In response, the CAM 310 may perform a read out operation on the read address (n) (step 420). For example, the CAM 310 may access an addressable storage space corresponding to the read address (n) 420, and output data stored therein as the read data 316 to the SES Daemon logic 340. Upon receiving the read data 316, the SES Daemon logic 340 may perform a soft error detection operation (step 422) to determine whether the read data 316 contains one or more soft errors. As mentioned above, any type of suitable error detection scheme is contemplated in this disclosure, including an ECC scheme, a repetition scheme, a checksum scheme, a Hamming distance based check scheme, a Hash function scheme, a horizontal and vertical redundancy check scheme, a polarity scheme and/or the like.

If no soft error is found in the read data (step 430), the process may move to increment the read address (n) (step 436) such that soft error scrubbing may be performed on another address, e.g., the next address (n+1). However, if a soft error is found in the data word (step 430), the SES Daemon logic 340 may perform a soft error correction operation (step 432). For example, the SES Daemon logic 340 may retrieve the correct data for the read data 316 from the SES storage 350. Once the correct data is obtained (step 432), the SES 320 may perform a write back operation (step 434) by, for example, sending the correct data as the CAM input data 332 and a write address (n) as the address signal 336 to the CAM 310. Further, the SES 320 may issue a write signal as the command signal 334 such that the CAM 310 may replace the existing incorrect data stored in the address (n) with the correct data. Upon completing the write back operation (step 434), the read address (n) may be incremented (step 436) as mentioned above and the process may loop back to determine whether the functional block 360 is in an idle state or not (step 410). Depending on whether the functional block 360 is an idle state or not, the process may repeat the normal operation, such as, e.g., steps 440, 442, 444, 446, or, alternatively, the soft error scrubbing operation, such as, e.g., steps 420, 422, 430, 432, 434, 436 on the address (n+1) of the CAM 310.

In accordance with various embodiments of the disclosure, the methods described herein are intended for operation with dedicated hardware implementations including, but not limited to, semiconductors, application specific integrated circuits (ASIC), programmable logic arrays, and other hardware devices constructed to implement the methods and modules described herein, which may be implemented for operation with software programs running on a computer processor. Furthermore, alternative software implementations including, but not limited to, distributed processing or component/object distributed processing, parallel processing, virtual machine processing, any future enhancements, or any future protocol can also be used to implement the methods described herein.

While the disclosure has been described in terms of examples of the embodiments, those skilled in the art will recognize that the disclosure can be practiced with modifications in the spirit and scope of the appended claims. These examples given above are merely illustrative and are not meant to be an exhaustive list of all possible designs, embodiments, applications or modifications of the disclosure.

What is claimed is:

1. A method for using a data processing system comprising a memory, a first functional block and a second functional block, the memory comprising a plurality of addressable storage spaces, a first data port in communication with the first functional block, and a second data port in communication with the second functional block, the method comprising:
- sending a first read request for a first address of the memory for a logic operation performed by the first functional block;
- sending a second read request for a second address of the memory for soft error scrubbing performed by the second functional block;
- comparing the first address and the second address;
- outputting first data stored in the first address and second data stored in second address to the first functional block and the second functional block, respectively, via the first port and the second port, respectively, when the first address and the second address are different;
- performing the soft error scrubbing on the second data by operating the second functional block; and
- sending a third read request for a third address of the memory for the soft error scrubbing when the second address is identical to the first address.

2. The method of claim 1, further comprising performing the logic operation based on the first data by operating the first functional block.

3. The method of claim 1, wherein sending the third read request comprises incrementing the second address.

4. A method for using a data processing system comprising a memory, an arbiter, a first functional block and a second functional block, the memory comprising a plurality of addressable storage spaces, the arbiter in communication with the memory and comprising a first data port in communication with the first functional block and a second data port in communication with the second functional block, the method comprising:
- sending a first read request to the arbiter for a first address of the memory for a logic operation performed by the first functional block;
- sending a second read request to the arbiter for a second address of the memory for soft error scrubbing performed by the second functional block;
- comparing the first address and the second address;
- outputting the first data stored in the first address of the memory to the first functional logic via the first port of the arbiter;
- outputting the second data stored in the second address of the memory to the second functional logic via the second port of the arbiter when the first address and the second address are different;
- performing the soft error scrubbing on the second data by operating the second functional block; and
- sending a third read request to the arbiter for a third address of the memory for the soft error scrubbing when the second address is identical to the first address.

5. The method of claim 4, further comprising performing the logic operation on the first data by operating the first functional block.

6. The method of claim 4, wherein the sending the third read request comprises incrementing the second address.

7. A microchip, comprising:
- a memory configured to store data in a plurality of addressable storage spaces thereof, the memory comprising a first data port and a second data port;
- a first functional block configured to send a first read request for a first address of the memory for performance of a logic operation;
- a second functional block configured to send a second read request for a second address of the memory for performance of a soft error scrubbing operation; and
- a control unit configured to compare the first address and the second address and to cause the memory to output first data stored in the first address and second data stored in the second address to the first functional block and the second functional block, respectively, via the first port and the second port, respectively, when the first address and the second address are different;
- wherein the second functional block is further configured to send a third read request for a third address of the memory when the control unit determines that the second address is identical to the first address.

8. The microchip of claim 7, wherein sending the third read request comprises incrementing the second address.

9. The microchip of claim 7, wherein the second functional block accesses the memory without interfering with the logic operation of the first functional block.

10. The microchip of claim 9, wherein the first functional block and the second functional block substantially simultaneously access different storage spaces of the memory.

11. The microchip of claim 7, wherein the second functional block is configured to:
- read first data stored in a first addressable storage space of the memory;
- detect a soft error included in the first data; and
- write correct first data in the first addressable storage space of the memory.

12. The microchip of claim 11, wherein the first data comprises an error detection code.

13. The microchip of claim 12, wherein the error detection code comprises a parity bit.

14. The microchip of claim 11, further comprising a data storage for storing the correct first data.

15. The microchip of claim 7, wherein the memory comprises a cache memory.

16. A microchip, comprising:
- a memory configured to store data in addressable storage spaces;
- an arbiter connected to the memory, the arbiter comprising a first data port and a second data port;
- a first functional block configured to send a first read request to the arbiter for a first address of the memory for performance of a logic operation; and
- a second functional block configured to send a second read request to the arbiter for a second address of the memory for performance of a soft error scrubbing operation;
- wherein the arbiter is configured to:
  - compare the first address and the second address;
  - output the first data stored in the first address of the memory to the first functional logic via the first port of the arbiter;
  - output the second data stored in the second address of the memory to the second functional logic via the second port of the arbiter when the first address and the second address are different;
- wherein the second functional block is further configured to send a third read request to the arbiter for a third address of the memory for the soft error scrubbing when the second address is identical to the first address.

17. The microchip of claim 16, wherein sending the third read request comprises incrementing the second address.

18. The microchip of claim 16, wherein the arbiter is configured to control the data traffic between the memory and the second functional block without interfering with the logic operation of the first functional block.

19. The microchip of claim 16, wherein the second functional block is configured to:

read first data stored in a first addressable storage space of the memory via the arbiter;

detect a soft error included in the first data; and write correct first data in the first addressable storage space of the memory via the arbiter.

20. The microchip of claim 19, wherein the first data includes an error detection code.

21. The microchip of claim 20, wherein the error detection code comprises a parity bit.

22. The microchip of claim 19, further comprising a storage configured to store the correct first data.

23. The microchip of claim 16, wherein the memory comprises a content-addressable memory (CAM).

* * * * *